(12) United States Patent
Cao et al.

(10) Patent No.: US 10,115,886 B2
(45) Date of Patent: Oct. 30, 2018

(54) TWIN ENGINEERING TO IMPROVE THE SWITCHABILITY AND ROTATABILITY OF POLARIZATIONS AND DOMAINS IN FERROELECTRIC AND PIEZOELECTRIC MATERIALS

(71) Applicant: The Hong Kong University of Science and Technology, Kowloon (HK)

(72) Inventors: Shigu Cao, Changsha (CN); Honghui Wu, Shenzhen (CN); Tongyi Zhang, Hong Kong (HK)

(73) Assignee: The Hong Kong University of Science and Technology, Hong Kong (CN)

( * ) Notice: Subject to any disclaimer, the term of this patent is extended or adjusted under 35 U.S.C. 154(b) by 330 days.

(21) Appl. No.: 14/943,963

(22) Filed: Nov. 17, 2015

(65) Prior Publication Data

US 2016/0172576 A1 Jun. 16, 2016

Related U.S. Application Data

(60) Provisional application No. 62/123,412, filed on Nov. 17, 2014.

(51) Int. Cl.
*H01L 41/187* (2006.01)
*H01L 41/253* (2013.01)
(Continued)

(52) U.S. Cl.
CPC ...... *H01L 41/1871* (2013.01); *H01L 41/0805* (2013.01); *H01L 41/18* (2013.01);
(Continued)

(58) Field of Classification Search
CPC ............... H01L 41/0805; H01L 41/187; H01L 41/1871; H01L 41/253; H01L 41/43; H01L 41/18; Y10T 29/42
See application file for complete search history.

(56) References Cited

U.S. PATENT DOCUMENTS 6,030,480 A * 2/2000 Face, Jr. ................. Y10T 29/42
156/160
7,955,641 B2 * 6/2011 Schneider ............... Y10T 29/42
29/25.35

(Continued)

FOREIGN PATENT DOCUMENTS

JP 2007096248 A * 4/2007

*Primary Examiner* — A. Dexter Tugbang
(74) *Attorney, Agent, or Firm* — Osha Liang LLP

(57) ABSTRACT

A method for forming deformation crystal twins in piezoelectric materials is disclosed. The method includes obtaining a crystalline piezoelectric material and deforming the crystalline piezoelectric material using a load. The method also includes heating the deformed crystalline piezoelectric material in an oxidative atmosphere to a predetermined temperature for a predetermined time to form a plurality of deformation crystal twins in the crystalline piezoelectric material. The method also includes allowing the crystalline piezoelectric material to cool to room temperature, and removing the load that induces the deformation of the crystalline piezoelectric material. Additionally, the deformation of the crystalline piezoelectric material is achieved by at least one of the following: compressing, stretching, shearing, torsion, and bending of the crystalline piezoelectric material. Further, the shearing creates a shear plane that acts as a twin boundary, which separates a plurality of deformation crystal twins with non-uniform orientation.

9 Claims, 8 Drawing Sheets

(51) Int. Cl.
*H01L 41/43* (2013.01)
*H01L 41/08* (2006.01)
*H01L 41/18* (2006.01)

(52) U.S. Cl.
CPC .......... *H01L 41/187* (2013.01); *H01L 41/253* (2013.01); *H01L 41/43* (2013.01); *Y10T 29/42* (2015.01)

(56) References Cited

U.S. PATENT DOCUMENTS

| | | | | |
|---|---|---|---|---|
| 2006/0006360 | A1* | 1/2006 | Takao | H01L 41/43 252/62.9 R |
| 2006/0012648 | A1* | 1/2006 | Ifuku | H01L 41/0805 347/72 |
| 2007/0257228 | A1* | 11/2007 | Tsukada | H01L 41/187 252/62.9 PZ |
| 2010/0077581 | A1* | 4/2010 | Chang | H01L 41/43 29/25.35 |

* cited by examiner

● Ba  ● O  • Ti

TWIN ENGINEERING TO IMPROVE THE SWITCHABILITY AND ROTATABILITY OF POLARIZATIONS AND DOMAINS IN FERROELECTRIC AND PIEZOELECTRIC MATERIALS

CROSS-REFERENCE TO RELATED APPLICATIONS

This application claims priority under 35 U.S.C. § 119(e) to U.S. Provisional Patent Application Ser. No. 62/123,412 filed on Nov. 17, 2014. Accordingly, U.S. Provisional Patent Application Ser. No. 62/123,412 is hereby incorporated by reference in its entirety.

BACKGROUND

Piezoelectrics and ferroelectrics (a special family of piezoelectrics) have wide applications, such as sensor, actuators, and memory devices. Switchability and rotatability of polarizations and domains are of the vital importance in ferroelectric and piezoelectric materials, because the major functions of ferroelectrics are realized by the switching/rotating properties. For memory devices, high signals and low threshold voltages are desired. For sensors, high signal and good agility are desired. For actuators, low voltage application, quick response and large deformation is desired. All of these applications of piezoelectric materials perform based on the switchability and rotatability of polarizations and domains.

For example, the key indices of the performance of ferroelectrics are the polarization and the coercive field. The larger the polarization, the larger the signal; the smaller the coercive field is, the easier for the polarization to switch. As the switching and rotation will cause a change in energy, such as electric energy, elastic energy and gradient energy, and incompatibility may exist within the ferroelectrics, and also between the ferroelectrics and the environment, polarizations in all unit cells may have difficulty switching or rotating to align in one direction because of the difficulty in overcoming the energy barriers brought by the incompatibility. Such difficulty may hinder the performance of these materials, especially in polycrystalline materials which have much more incompatibility intergranually and in thin films that may have a fundamental incompatibility problem between the films and the substrates.

In the research area of ferroelectrics, the term of "twin" usually refers to domain twins, which in tetragonal ferroelectrics may also be referred to as (110) twins. These types of twins are generated by the difference in polarization in adjacent areas, and the polarizations may change directions or even disappear below the Curie temperature under external loading (such as mechanical loading and/or electric field loading). For example, in such tetragonal perovskites, if neighboring domains in one grain (or a single crystal) take <100> direction and <010> direction respectively as the polarization direction, the lattices may be elongated along an orthogonal axis, forming an imaging structure with respect to a (110) plane. This structure is typically referred to as a (110) domain twin structure. The domain twin structure is believed to relieve the strain energy which rises from mechanical constraints. However, in the domain twin structure, each of the domains forming the twin may have only three strain variants in total, which may limit elongation compatibility between polarizations of adjacent grains or polarizations between the material and the substrate.

SUMMARY

In general, in one aspect, one or more embodiments relate to a method for forming deformation crystal twins in piezoelectric materials that includes obtaining crystalline piezoelectric material. The crystalline piezoelectric material is deformed. The crystalline piezoelectric material is heated in an oxidative atmosphere to a predetermined temperature for a predetermined time to form a plurality of deformation crystal twins in the crystalline piezoelectric material. The crystalline piezoelectric material is allowed to cool to room temperature. The deformation is removed.

In general, in another aspect, one or more embodiments relates to a device that includes a plurality of deformation crystal twins formed in a crystalline piezoelectric material. The plurality of deformation crystal twins is formed by deforming the crystalline piezoelectric material at a predetermined temperature for a predetermined time.

Other aspects of the invention will be apparent from the following description and the appended claims.

DETAILED DESCRIPTION

Figure 1A:
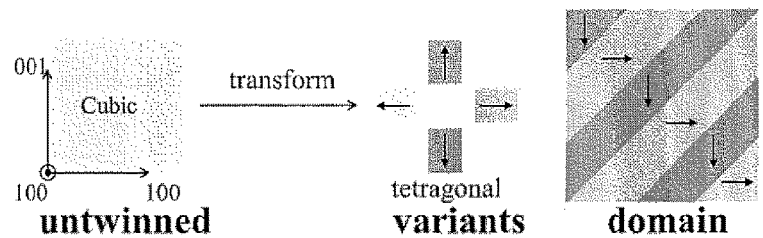
FIGS. 1A, 1B, and 1C show schematics in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a piezoelectric device and method for manufacturing a piezoelectric device with an increased switchability and rotatability of the polarization. More specifically, embodiments of the invention relate to a ferroelectric material that includes a plurality of deformation crystal twins. The presence of the deformation crystal twins allows the coercive field to be reduced, the response time to be shorter, and the deformation under electric field may be larger. The crystal twins are introduced into the piezoelectric material by deformation twinning.

In one or more embodiments described herein, the piezoelectric material, or ferroelectric material, is mechanically deformed by applying stress or strain to the material at a predetermined temperature for a predetermined time. In one or more embodiments, the predetermined temperature is greater than the Curie temperature of the material, but less than the melting temperature of the material. This predetermined temperature provides the energy necessary for the crystal twins to form under deformation, but is not so great to degrade the basic crystalline structure of the material. In one or more embodiments, the temperature is high enough, together with the mechanical loading, to activate the lattice to change to form the deformation crystal twins.

This deformation crystal twinning is quite different from the commonly believed theory of an oxygen vacancy effect. In accordance with one or more embodiments, the deformation twinning may be shear controlled, i.e., driven by mechanical loading, at an appropriately high temperature at which the lattice is energetic to change. For example, for a bulk material, crystal twins may be induced by any loading configuration that may generate shear stress or strain. The deformation may be compression, stretching, shearing, torsion, or bending in accordance with one or more embodiments described herein. For a film piezoelectric material deposited on a substrate, deformation crystal twins may be induced by bending or mechanically manipulating the substrate at the predetermined temperature so that the deformation may be exerted on the film uniformly in accordance with one or more embodiments described herein.

In accordance with one or more embodiments described herein, by introducing more domain variants in the material by deformation crystal twinning, the polarizations may have an increased degree of freedom to switch and rotate the polarization. Further, the number of nucleation sites for the crystal twins may be increased because the grain boundaries are non-uniform sites in accordance with one or more embodiments described herein.

For example, one method to increase the switchability and rotatability of polarization in ferroelectrics is to increase the number of nucleation sites where the polarizations started to switch or rotate ahead of the polarizations at other places. Typically, in other systems, this is achieved at the expense of other ferroelectric properties, by introducing dislocations or defects.

In polycrystalline ceramics, the grains with different domain variants may negatively affect the ferroelectric distortion of one another. The domain variants have two compositions, one is strain variants, the other is polarization variants. One scheme to increase the strain variants to give the grains more degree of freedom to incorporate is to let the grains incorporate with each other in distortion. However, in a certain crystals, only a limited number of variants are available. For example, as previously mentioned, perovskites only have three strain variants in tetragonal ferroelectric phase, which makes it difficult to incorporate the distortion consistently. There are similar schemes to let the grains incorporate with each other in electric interaction. However, these schemes may also be limited in variants.

One or more embodiments of the invention may provide for the following advantages. First, the crystal twins are non-defective nucleation sites, while typical methods introduce defective nucleation sites (defects) which at the same time may decrease the ferroelectric properties. In addition, conventional methods usually generate nucleation sites at an interface, which is a 2D scheme. In embodiments disclosed herein, crystal twins may be introduced at the interior parts of the materials, which is a 3D scheme. As such, more of the material is available for the formation of crystal twins in accordance with embodiments herein.

Embodiments of the invention advantageously provide a mechanism to increase the domain variants. Although the introduction of more domain variants has been studied, these techniques typically just make some parts of a film exhibit another variants different than other parts of the film. These variants are typically preset alternatives of the crystals, in contrast to the embodiments described herein.

In one or more embodiments, new domain variants are advantageously created by deformation crystal twinning. For example, in tetragonal peroveskites, as noted above, an untwined grain haves three strain variants and six polarization variants. In accordance with one or more embodiments, as described in relation to FIG. 1, a deformation crystal twinned grain may have six strain variants and twelve polarization variants. Thus, embodiments of the invention may increase the possible domain variants.

Embodiments of the invention provide a mechanism to induce crystal twins, which in tetragonal ferroelectrics referred to as (111) twins, by deformation crystal twinning. Typically, (111) twins in ferroelectrics are considered defect structures induced by oxygen vacancies, in contrast to the embodiments discussed herein. Embodiments of the invention are shearing controlled as demonstrated in the figures below.

Figure 1B:
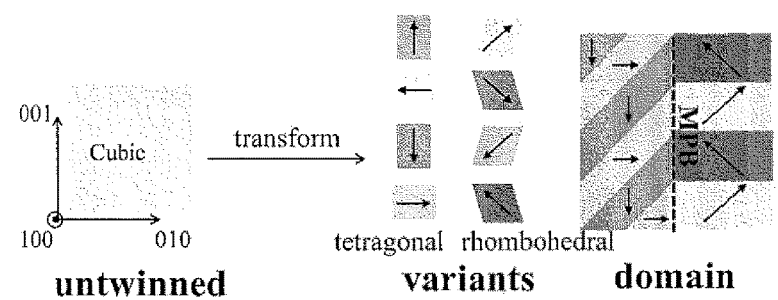
Figure 1C:
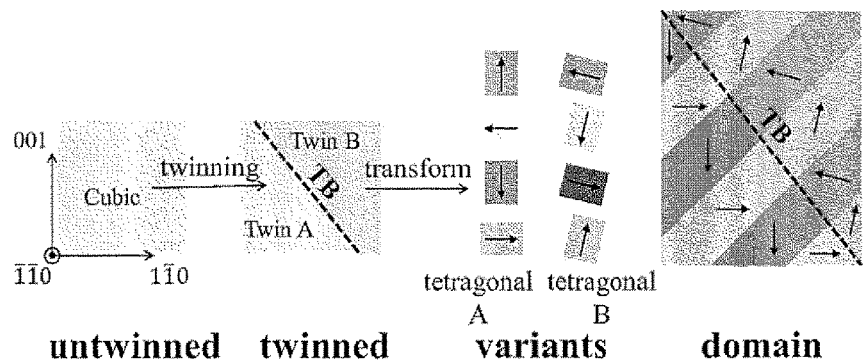

FIGS. 1A, 1B, and 1C are schematics describing the concept of deformation twin engineering in accordance with one or more embodiments. In FIGS. 1A, 1B, and 1C, the illustrations are two-dimensional, and shown in a projected view, so that the number of variants shown is smaller than the spatial case.

In conventional ferroelectrics, as demonstrated in FIG. 1A, a cubic crystal may be transformed into six tetragonal variants (four shown in the projected view of FIG. 1A) below the Curie temperature to form a laminated domain configuration. FIG. 1B describes a ferroelectric material with a conventional Morphotropic Phase Boundary (MPB) that transforms a cubic crystal into six tetragonal and eight rhombohedral variants below the Curie temperature to form a more complicated domain configuration. FIG. 1C describes the deformation crystal twin engineering in accordance with embodiments described herein. In accordance with one or more embodiments, a cubic crystal may be transformed into mechanical twins first above the Curie temperature, and each twin may then be transformed into six ferroelectric variants below the Curie temperature. The deformation crystal twin engineering may form a complicated domain configuration similar to that with MPB. In other words, in accordance with one or more embodiments, the deformation crystal twins may provide for more ferroelectric variants below the Curie temperature; thus, increasing the switchability and rotatability of the polarization in the ferroelectric material.

Figure 2A:
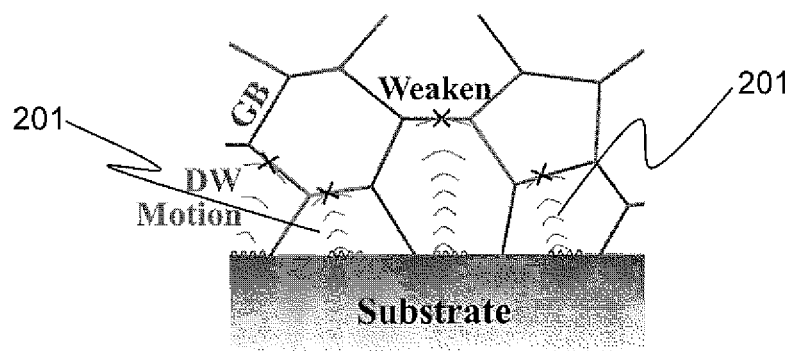
FIGS. 2A and 2B show schematics in accordance with one or more embodiments of the invention.
Figure 2B:
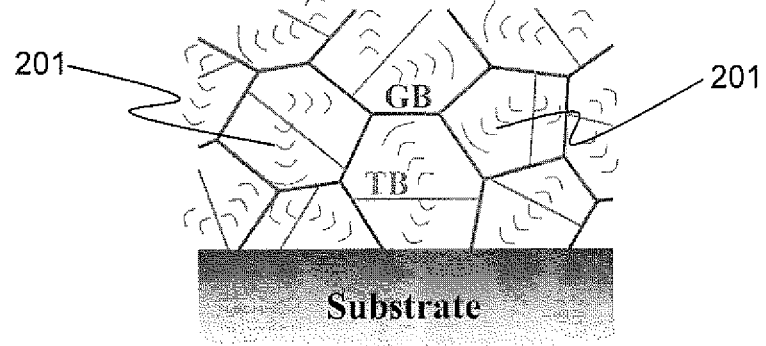

FIGS. 2A and 2B are a schematic describing the three dimensional nature of engineering one or more embodiments of the invention. In FIG. 2, the wave lines (201) demonstrate the location of the interfacial engineering in conventional 2D defect based engineering (FIG. 2A) compared to embodiments discussed herein which utilize a 3D interfacial engineering (FIG. 2B).

As noted above, conventionally, observed (111) twin structures have previously been induced by an oxygen vacancy. However, these types of domain twins may have negative effects from the grain boundaries (GBs) on intergranular domain propagation. These conventional domain twins may experience changes below the Curie temperature, which may have adverse effects on the degree of freedom for polarization switching. This type of two dimensional twin engineering is described in FIG. 2A. FIG. 2A demonstrates how a grain boundary (GB) may be weakened in such a 2D defect-based process. For example, perovskites are believed to have (111) twin structures only when oxygen vacancies, a type of point defect, exist, because it is believed that the highly repulsive force between $Ti^{4+}$ ions across the (111) twin boundary will make the crystal structure unstable.

However, as shown in FIG. 2B, embodiments described herein utilize a three dimensional deformation crystal twin engineering that may take effect within each crystal twinned grain without the need to consider negative effects of the grain boundaries (GB) on intergranular domain propagation. FIG. 2B demonstrates how the twin boundary (TB) may be introduced without weakening the grain boundary (GB). In other words, one or more embodiments described herein provide a three dimensional spatial network of nucleation sites within the crystalline structure, in contrast to the less stable conventional defect-based 2D engineering of domain twins which only occurs at an interface. This advantage of embodiments of the invention is particularly relevant with regard to perovskites because no mechanism previously existed to generate (111) twins in perovskites other than introducing point defects as described above.

Figure 3A:
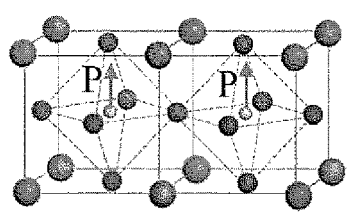
FIGS. 3A, 3B, 3C, and 3D show schematics in accordance with one or more embodiments of the invention.
Figure 3B:
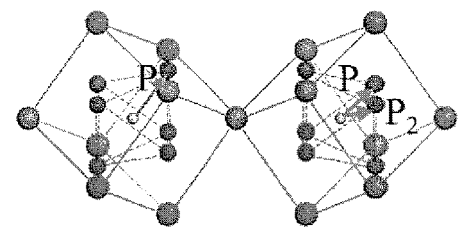
Figure 3C:
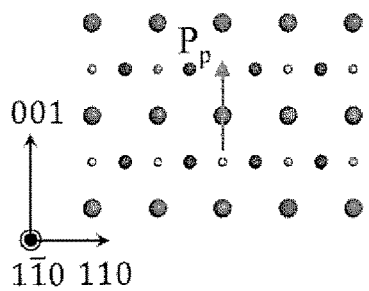
Figure 3D:
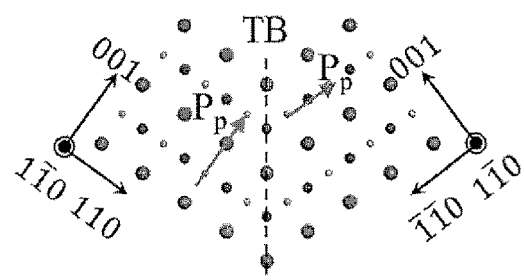

FIGS. 3A, 3B, 3C, and 3D are schematics demonstrating the crystal structure and polarization directions in accordance with one or more embodiments of the invention. FIGS. 3A and 3C describe the structure prior to the deformation crystal twinning, and FIGS. 3B and 3D describe the structure after the deformation crystal twinning in accordance with one or more embodiments of the invention. FIGS. 3C and 3D demonstrate the projection of the polarization of untwinned structure (FIG. 3C) and deformation twinned structure (FIG. 3D) on (1 $\bar{1}$ 0) plane. P and $P_2$ denote polarizations, and $P_p$ denotes the projected polarization on (1 $\bar{1}$ 0) plane. It is noted that in projection view of FIGS. 3C and 3D, the Ba atom columns are shown for the Ba—O overlapped columns, which is consistent with observed electron microscopy images due to the relative weak reflection strength of oxygen atoms.

In the example of barium titanate (BT) based tetragonal perovskite, i.e., barium titanate or doped barium titanate tetragonal perovskite, (111) deformation crystal twins may have a mirroring structure with respect to the (111) crystal plane in accordance with one or more embodiments of the invention, which form a polarization gradient across the (111) plane as demonstrated in FIGS. 3B and 3D.

Figure 4A:
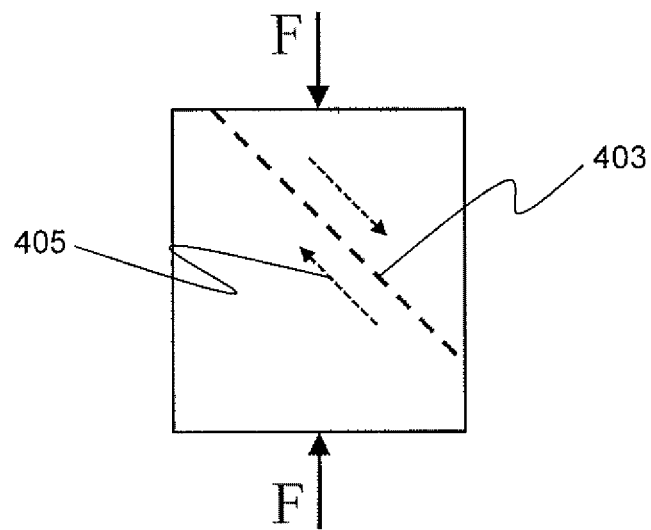
FIGS. 4A and 4B show schematics in accordance with one or more embodiments of the invention.
Figure 4B:
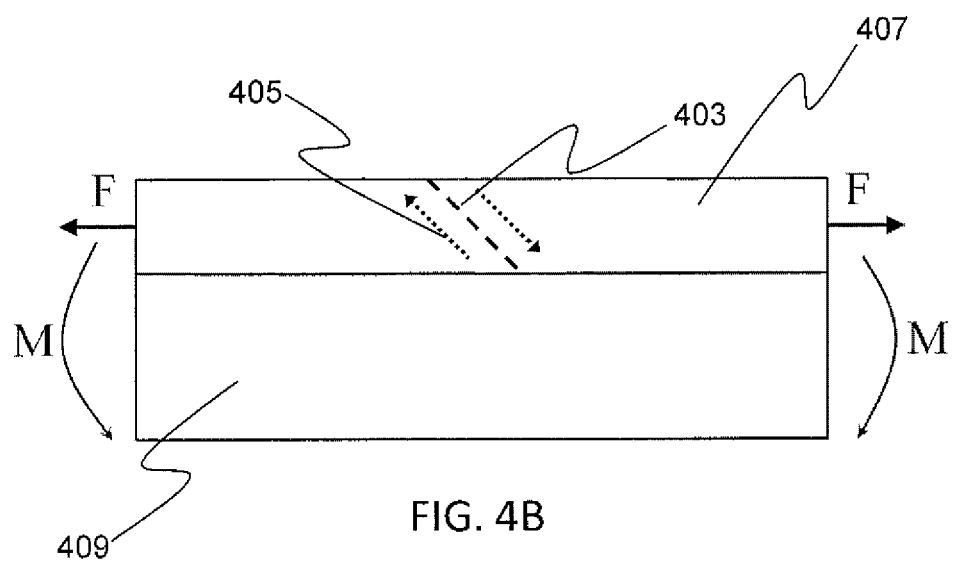

FIGS. 4A and 4B are a schematics demonstrating types of deformation that may be used to facilitate the formation of deformation crystal twins in accordance with one or more embodiments of the invention. Embodiments of the invention may utilize compressing, stretching, shearing, torsion, bending, or a combination thereof of the crystalline piezoelectric material to provide the deformation. For example, as shown in FIG. 4A, the deformation may be facilitated through compression by applying opposing forces (F). Such compression may induce a macroscopic shear stress (405) and complex microstrain in a shear plane (403) of the material. FIG. 4A demonstrates how the deformation may be applied to bulk materials, and further emphasizes the 3D nature of the deformation crystal twinning method in accordance with one or more embodiments.

Referring to FIG. 4B, in one or more embodiments, the deformation of the piezoelectric material (407) at the predetermined temperature may be achieved with the presence of a substrate (409). For example, the substrate (409) may be bent in a direction (M) to induce opposing forces (F) in the piezoelectric material (407). In the example of the film configuration of FIG. 4B, the deformation facilitating the formation of deformation crystal twins is realized by bending the material (407) and substrate (409) to generate an overall shear stress (405) along a shear plane (403).

Figure 5:
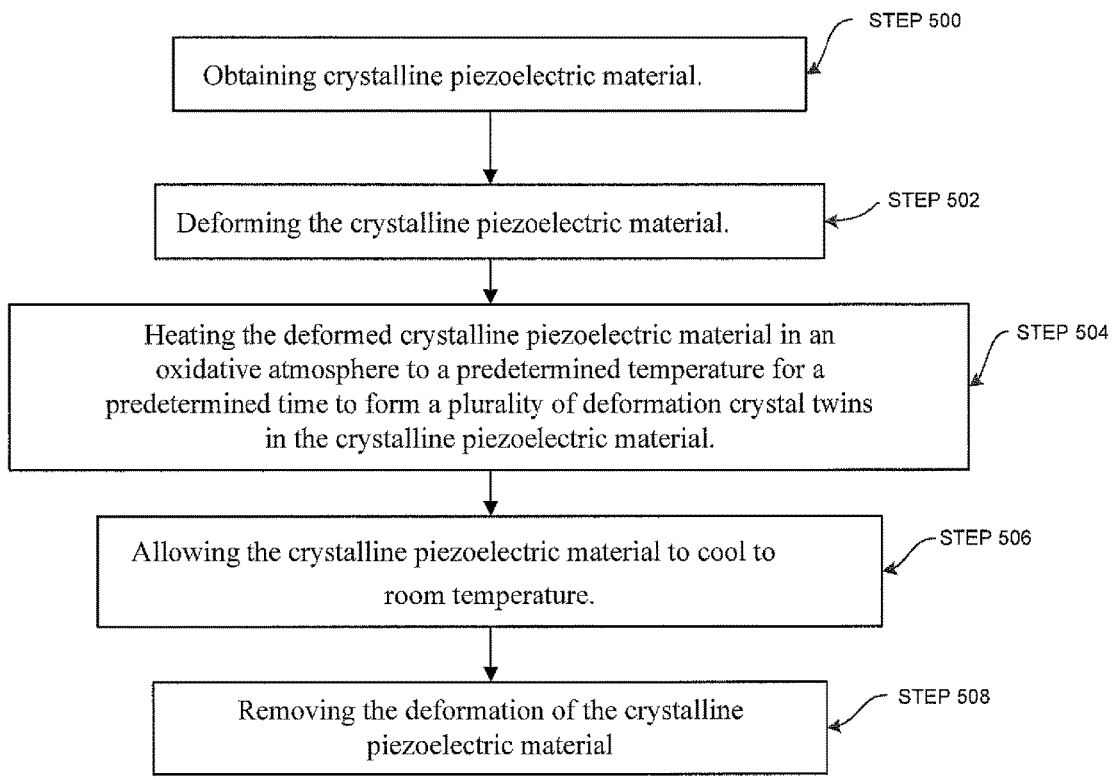
FIG. 5 shows a flow chart in accordance with one or more embodiments of the invention.

FIG. 5 is a flow chart for the production of deformation crystal twins in accordance with one or more embodiments of the invention. In step 500, the crystalline piezoelectric material is obtained. For example, the crystalline piezoelectric material may be grown or formed according to known techniques, or purchased. In Step 502, the crystalline piezoelectric material is deformed by mechanically imposing forces on the material, for example as described above with respect to FIG. 4. In Step 504, the deformed crystalline piezoelectric material is heated in an oxidative atmosphere to a predetermined temperature for a predetermined time to form a plurality of deformation crystal twins in the crystalline piezoelectric material. It is noted that the crystalline piezoelectric material may be deformed and then placed in a furnace or oven. Alternatively, the crystalline piezoelectric material may be placed in the furnace or oven at the predetermined temperature and then deformed.

As noted above, in one or more embodiments, the predetermined temperature is greater than the Curie temperature of the material, but less than the melting temperature of the material. The predetermined temperature provides the energy necessary for the crystal twins to form under deformation, but the predetermined temperature and predetermined time are selected so as to not degrade the basic crystalline structure of the material. In other words, the predetermined temperature is high enough to cause the lattice to change, together with the mechanical loading, to form the deformation crystal twins. The predetermined temperature is typically in the 400-700° C. degree range with a predetermined time of 2 hours for many materials in accordance with embodiments discussed herein. One of ordinary skill in the art will now appreciate that the temperature and time work in conjunction and may be varied provided the basic crystalline structure of the material is not degraded. For example, for a given material, a higher temperature for a shorter time or lower temperature for a longer time may produce similar results.

In Step 506, the crystalline piezoelectric material is allowed to cool to room temperature and, in Step 508, the deformation may be removed. However, it is noted that the deformation may be removed prior to removing the material from the furnace or oven and, then, the crystalline piezoelectric material may be allowed to cool to room temperature.

In accordance with one or more embodiments, the crystalline piezoelectric material may be disposed, or grown, onto a substrate, and the crystalline piezoelectric material may be deformed by manipulation of the substrate. Aspects of these types of embodiments are described below in reference to FIGS. 6-8.

Figure 6:
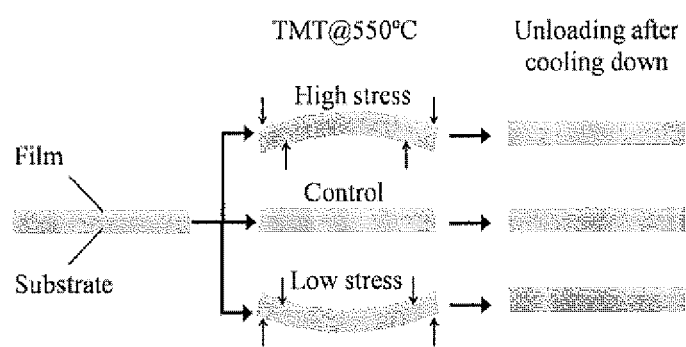
FIG. 6 shows a schematic in accordance with one or more embodiments of the invention.

FIGS. 6-8 demonstrate an example of the disclosed thermomechanical treatment (TMT) using a barium titanate (BT) film deposited on a substrate in accordance with one or more embodiments of the invention.

FIG. 6 is a schematic describing the deformation of a BT film in accordance with one or more embodiments of the invention. When the ferroelectric material is deposited on a substrate as a film, the deformation crystal twinning may be realized by bending the substrate at the predetermined temperature. During bending, an external stress will be exerted on to the films, generating the deformation crystal twins. In this example, BT films were deposited on Pt(100 nm)/Ti(10 nm)/SiO$_2$/Si substrates using a conventional sol-gel method and crystallized at 800° C. The samples were then allowed to cool to room temperature. Cooling results in tensile residual stress in films due to the mismatch of thermal expansion coefficient between the film and the substrate. This tensile residual stress provides a small degree of deformation. In order to demonstrate that the production of deformation crystal twins in the films is dependent on the deformation, different samples were deformed mechanically in two different ways, and heated at 550° C. for two hours.

As shown in FIG. 6, the first group of films, labeled as "high stress", was bent upward by a four-point bending of the substrate to exert tensile bending stress to the films. This first group therefore was subjected to shearing deformation of the film. The "high stress" deformation demonstrates the greatest degree of deformation in these examples. For comparison, films were also bent downward, resulting in a compressive deformation that tends to cancel the original tensile residual stress. These samples are labeled as "low stress" films, which is the least degree of deformation in these examples. "Low stress" films, therefore, should possess minimum number of deformation twins. As a "control," films were also subjected to no deformation at 550° C., for which the magnitude of the stress may be intermediate. In other words, the degree of deformation in the "control" example is between that of the "high stress" and "low stress" examples due to the tensile residual stress in films because of the mismatch of thermal expansion coefficient of the film with the substrate. In all of these examples, the thicknesses of the BT films were measured by ellipsometry to be around 320 nm.

The highest density of deformation crystal twins are observed in the "high stress" film in accordance with one or more embodiments described herein. The higher density of deformation crystal twins indicates that the crystal twins are highly related to degree of deformation. These results were verified using High Resolution transmission electron microscopy (HRTEM) and nanobeam diffraction (NBD) pattern techniques (data not shown). In these examples, the <100> lattice spacing was 4.13±0.010 Å and the <110> lattice spacing is 2.90±0.01 Å on one side of the twin boundary (TB), while the <100> lattice spacing of 4.09±0.00 Å and <110> lattice spacing of 2.92±0.01 Å on the other side of the TB. These results indicate that the <100> direction on the one side of the TB is the direction of the spontaneous polarization, i.e., the c axis, while on the other side of the TB, the <100> lattice spacing is the lattice constant a. The head-to-tail dipole sequence across the TB is as expected because it minimizes the electrostatic energy. HRTEM and associated NBD pattern proves that the deformation crystal twin structure is the atomic arrangement expected for a deformation crystal twin, and the polarization changes its orientation across the TB in accordance with embodiments described herein.

Figure 7A:
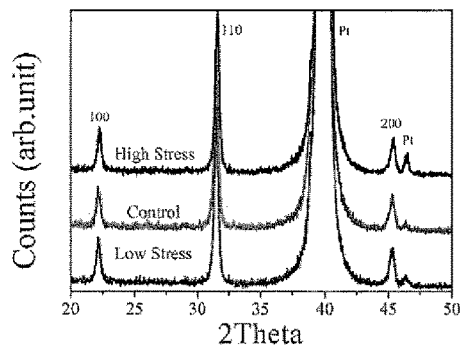
FIGS. 7A, 7B, 7C, and 7D show graphs in accordance with one or more embodiments of the invention.

FIG. 7A is X-ray diffraction (XRD) patterns of the films described in FIG. 6 in accordance with one or more embodiments of the invention. The XRD patterns of the films clearly indicate that all films are well crystallized to the perovskite structure, and there is no difference in the crystalline structure and orientation among different groups of films. This is significant in that it verifies that the basic crystalline (perovskite) structure is not degraded or damaged during the TMT process in accordance with one or more embodiments described herein.

Figure 7B:
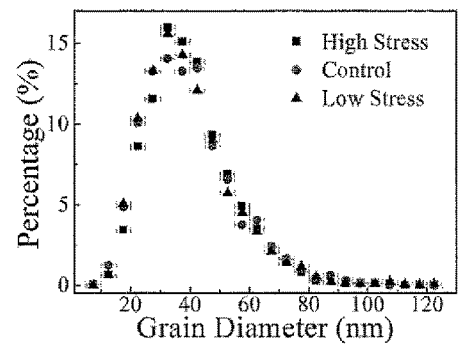

FIG. 7B demonstrates the grain size distribution of each group of the "high stress," "low stress," and "control" films. The data shown in FIG. 7B was obtained using transmission electron microscopy (TEM). FIG. 7B demonstrates that the grain size distributions are almost identical in the "high stress," "low stress," and "control" films, further confirming the basic crystalline structure is preserved.

FIGS. 7A and 7B demonstrate that there is little difference in other microstructure characteristics among three groups of films in accordance with embodiments of the invention. This is significant in that it helps to verify that the basic crystalline structure has not been degraded or damaged. As noted above, the upper limits of the combination of predetermined temperature and predetermined time are established as to not degrade the basic crystalline structure of the material. In other words, in embodiments of the invention, the upper limits of the predetermined temperature and predetermined time may be established such that the basic crystalline structure is not degraded or damaged.

Figure 7C:
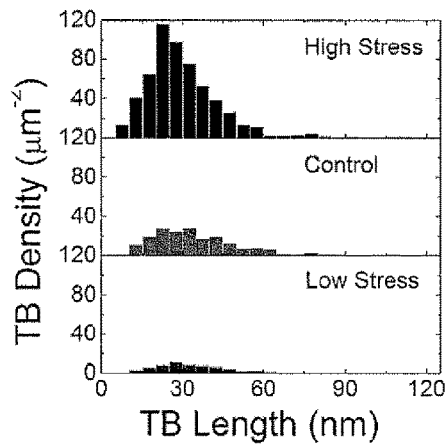

FIG. 7C demonstrates the number of deformation crystal twin boundaries (TBs) of a particular length of TB per unit area ($\mu m^{-2}$) in the plane of the substrate. This is a direct measurement of the density of deformation crystal twin structures described herein. FIG. 7C demonstrates that that the peak TB lengths are all around 28 nm, consistent with FIGS. 7A and 7B. Also, it is clear from FIG. 7C that the density of TBs and, thus, the number of deformation crystal twins is greater in the "high stress" example, followed by the "control" example, and then the "low stress" examples.

As shown in FIG. 7C, embodiments of the invention may provide for greater than 100 deformation crystal twins per square micron; however, the invention is not limited to such. The number of deformation crystal twins per area may be engineered depending on the desired characteristics of the piezoelectric device. For example, the degree of deformation, predetermined temperature, and predetermined time for a given piezoelectric material may be engineered to produce a desired number of deformation crystal twins and, hence engineer the characteristics of the piezoelectric device.

Figure 7D:
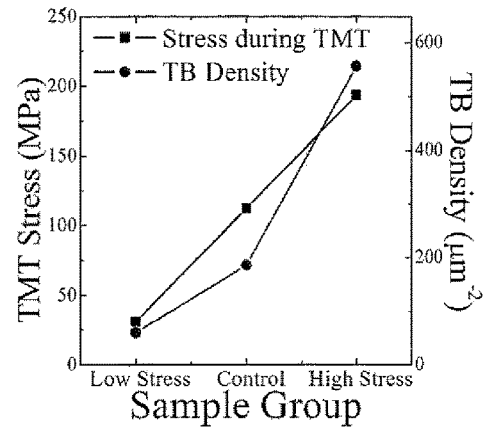

FIG. 7D demonstrates the correlation between the TB density and the stress magnitude during the TMT in accordance with one or more embodiments of the invention. FIG. 7D demonstrates that a higher stress amplitude results in higher TB density. In FIG. 7D, the stress in the control samples was measured by XRD, and the other two TMT stresses were calculated as the sum of the stress in the control samples and the bending stress. The correlation between the TB density and the TMT stress show in FIG. 7D indicates that the deformation crystal twins are introduced by the mechanical deformation in accordance with one or more embodiments of the invention.

FIG. 8 demonstrates the enhanced switchability of the polarization of the deformation crystal twins in accordance with one or more embodiments of the invention. FIG. 8A is the measured hysteresis polarization (P) expressed as $\mu C/cm^2$ versus the applied electric field (E) expressed as kV/cm in accordance with one or more embodiments. FIG. 8A demonstrates that the increased twin density decreases the coercive field while increases the apparent saturation polarization.

Figure 8A:
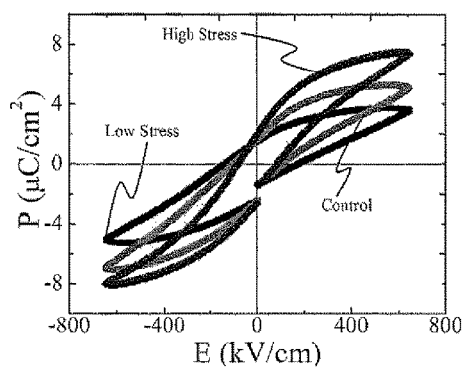
FIGS. 8A, 8B, 8C, and 8D show graphs in accordance with one or more embodiments of the invention.
Figure 8B:
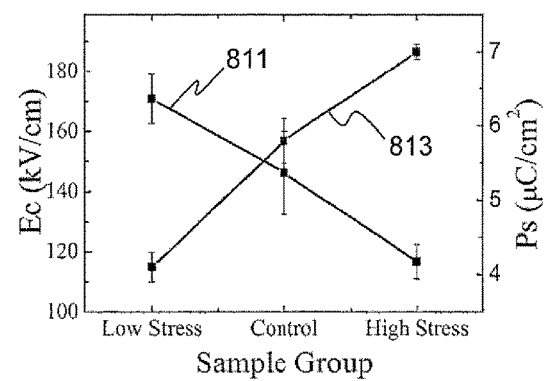

FIG. 8B demonstrates the coercive field ($E_c$) (811) and apparent saturation polarization ($P_s$) (813) determined from the measured P-E loops of FIG. 8A. With more than 30 samples tested in each group, statistics show that the "high stress" and, thus, the high density deformation crystal twin films have coercive field that is 32% smaller than "low stress" and low density deformation crystal twin film and 20% smaller than the "control." Further, the "high stress" example has an apparent saturation polarization is 72% higher than "low stress" film and 22% higher than the "control."

One of ordinary skill in the art will appreciate that it is was previously difficult to achieved a reduced coercive field and enhanced polarization simultaneously in ferroelectric ceramics. Typically, this may only be achieved through a morphotropic phase boundary (MPB). However, MPB is known to have tough requirements on the material composition because of the complex-structure and the MPB materials may require a complicated and costly process to prepare. Embodiments of the invention utilize deformation crystal twin engineering, which increases the number of ferroelectric variants in each grains, and thus the degree of freedom for switching, similar to MPB, but without the MPB material composition requirements.

Figure 8C:
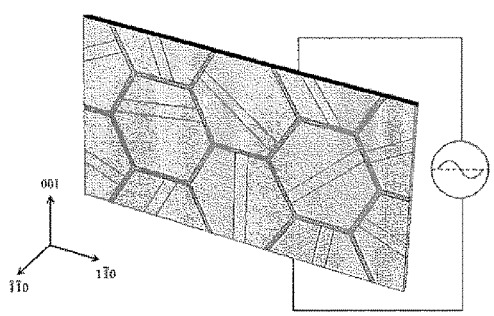
Figure 8D:
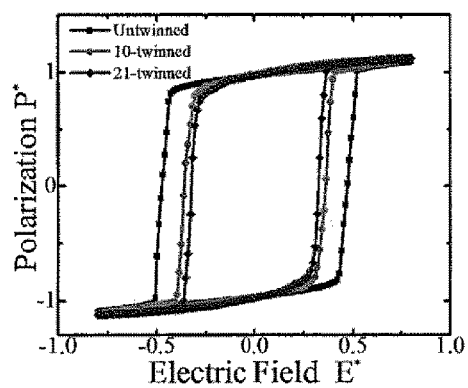

This concept is further demonstrated by FIGS. 8C and 8D which are common phase field simulations for polycrystalline BTs with and without (111) twins in accordance with one or more embodiments of the invention. FIG. 8C demonstrates the phase field simulation model and FIG. 8D are P-E hysteresis loops (in arbitrary units) determined from the phase field simulation. In FIG. 8D, the method used in these simulations is a common phase field simulation approach that has already been adopted widely (see "Phase-Field Simulation of Polarization Switching and Domain Evolution in Ferroelectric Polycrystals," Acta Materialia 53(20):5313-5321 (2005)). FIG. 8D demonstrates the clear difference in coercive field as a function of the number of deformation crystal twins in accordance with one or more embodiments of the invention.

The above example demonstrates the formation of the deformation crystal twins in a BT based film deposited on a Pt(100 nm)/Ti(10 nm)/SiO$_2$/Si substrate in accordance with one or more embodiments of the invention. However, embodiments of the invention are not limited to these materials. For example, the film may include one or more of barium strontium titanate, lead zirconate titanate, lithium niobium, potassium sodium niobium, lead magnesium niobate, lithium tantalite, and including one or more of the listed materials or a modified form of these materials. Examples of the substrate include, but are not limited to, high temperature metals, such as titanium, molybdenum, tungsten, chromium, nicole, and cobalt. Alternatively, the substrate may comprise an alloy based on these materials, such as steel, hastelloy, and Inconel may be used. The material of the substrate may also include one or more ceramics or oxides, such as MgO, SrTiO$_3$, and SiC. Alternatively, the substrate may comprise high temperature polymers, such as Polyimide.

Embodiments of the claimed invention advantageously increase the switchability and rotatability of the polarization in piezoelectric materials by mechanically deforming the material at a predetermined temperature for a predetermined time. One or more embodiments of the invention advantageously provide more domain variants and nucleation sites as a three dimensional process. Further, embodiments of the invention are advantageously not defect based, as in other piezoelectric devices.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for forming deformation crystal twins in piezoelectric materials, the method comprising:
   obtaining crystalline piezoelectric material;
   deforming the crystalline piezoelectric material using a load;
   heating the deformed crystalline piezoelectric material in an oxidative atmosphere to a predetermined temperature for a predetermined time to form a plurality of deformation crystal twins in the crystalline piezoelectric material;
   allowing the crystalline piezoelectric material to cool to room temperature;
   removing the load that induces the deformation of the crystalline piezoelectric material,
   wherein the deforming of the crystalline piezoelectric material is achieved by at least one of the following: compressing, stretching, shearing, torsion, and bending of the crystalline piezoelectric material, and
   wherein the deforming of the crystalline piezoelectric material creates a shear plane that acts as a twin boundary, which separates the plurality of deformation crystal twins with non-uniform orientation.

2. The method of claim 1, further comprising:
   disposing the crystalline piezoelectric material onto a substrate, wherein deforming the crystalline piezoelectric material is achieved by deforming the substrate.

3. The method of claim 2, wherein the crystalline piezoelectric material is based on barium titanate, and the predetermined temperature is 500-600° C.

4. The method of claim 1, wherein the plurality of deformation crystal twins are (111) crystal twins.

5. The method of claim 1, wherein the predetermined temperature is greater than a Curie temperature of the crystalline piezoelectric material, and less than a melting temperature of the crystalline piezoelectric material.

6. The method of claim 1, wherein the oxidative atmosphere has an oxygen partial pressure larger than ¼ of the oxygen partial pressure in air.

7. The method of claim 1, wherein a number of the deformation crystal twins is at least 100 per square micron in a given plane.

8. The method of claim 1, wherein the crystalline piezoelectric material is a perovskite.

9. The method of claim 1, wherein the crystalline piezoelectric material is single crystalline.

* * * * *